US009306024B2

(12) United States Patent
Chi et al.

(10) Patent No.: US 9,306,024 B2
(45) Date of Patent: Apr. 5, 2016

(54) METHOD OF FORMING SEMICONDUCTOR DEVICE

(71) Applicant: Taiwan Semiconductor Manufacturing Company Limited, Hsin-Chu (TW)

(72) Inventors: Liang-Chen Chi, Hsinchu (TW);
Chia-Ming Tsai, Zhubei (TW);
Chin-Kun Wang, Hsinchu (TW);
Jhih-Jie Huang, Taipei (TW);
Miin-Jang Chen, Taipei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 25 days.

(21) Appl. No.: 14/166,996

(22) Filed: Jan. 29, 2014

(65) Prior Publication Data
US 2015/0214321 A1 Jul. 30, 2015

(51) Int. Cl.
| | |
|---|---|
| *H01L 21/31* | (2006.01) |
| *H01L 21/469* | (2006.01) |
| *H01L 29/51* | (2006.01) |
| *H01L 21/02* | (2006.01) |
| *H01L 21/28* | (2006.01) |

(52) U.S. Cl.
CPC .......... *H01L 29/513* (2013.01); *H01L 21/0228* (2013.01); *H01L 21/02189* (2013.01); *H01L 21/02274* (2013.01); *H01L 21/28229* (2013.01)

(58) Field of Classification Search
CPC ..... H01L 21/31; H01L 21/469; H01L 21/022; H01L 21/02189; H01L 29/513
USPC ......................................................... 438/758
See application file for complete search history.

(56) References Cited

U.S. PATENT DOCUMENTS

| | | | | |
|---|---|---|---|---|
| 6,566,205 | B1 * | 5/2003 | Yu et al. | 438/287 |
| 6,849,908 | B2 * | 2/2005 | Hirano et al. | 257/410 |
| 7,494,940 | B2 * | 2/2009 | Doh et al. | 438/785 |
| 2009/0246949 | A1 * | 10/2009 | Kim et al. | 438/594 |

* cited by examiner

*Primary Examiner* — Phuc Dang
(74) *Attorney, Agent, or Firm* — Cooper Legal Group, LLC

(57) ABSTRACT

A semiconductor device and methods of formation are provided. A semiconductor device includes a dielectric film over a dielectric layer. The dielectric film includes a crystalline structure having a substantially uniform composition of zirconium, nitrogen and oxygen. The dielectric film is formed through in situ nitrogen plasma doping of a zirconium layer. The dielectric film functions as a gate dielectric. The dielectric film has a high dielectric constant between about 28-29 and has a low leakage current density of about $4.79 \times 10^{-5}$ $A/cm^2$. The substantially uniform distribution of nitrogen throughout the zirconium oxide of the dielectric film increases the k value of the dielectric film by between about 15% to about 17% as compared to a dielectric film that has a non-uniform distribution of nitrogen through a zirconium oxide layer.

20 Claims, 10 Drawing Sheets

METHOD OF FORMING SEMICONDUCTOR DEVICE

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
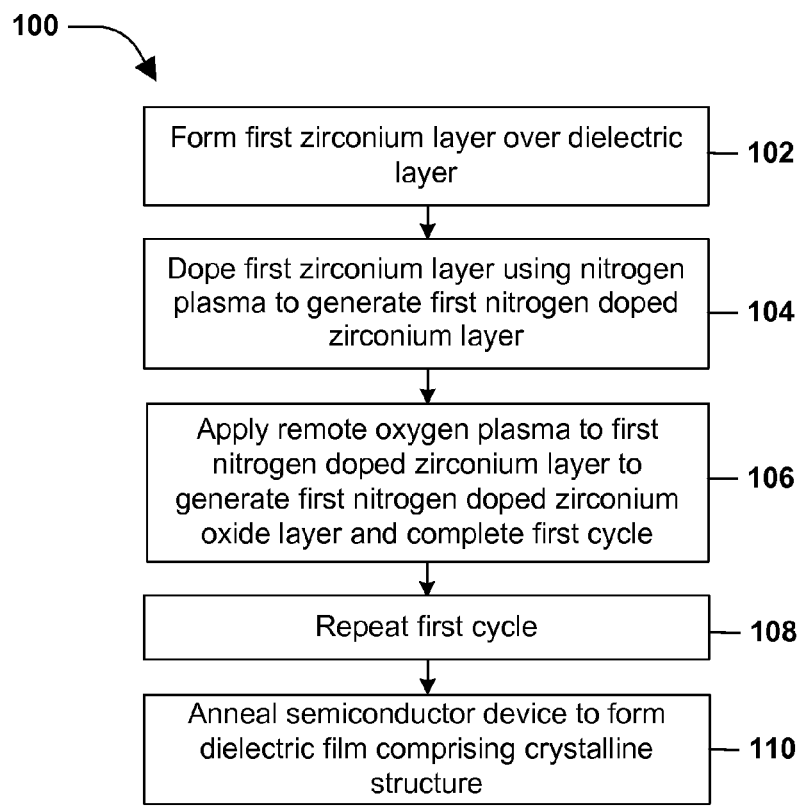
FIG. 1 is a flow diagram illustrating a method of forming a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

Figure 2:
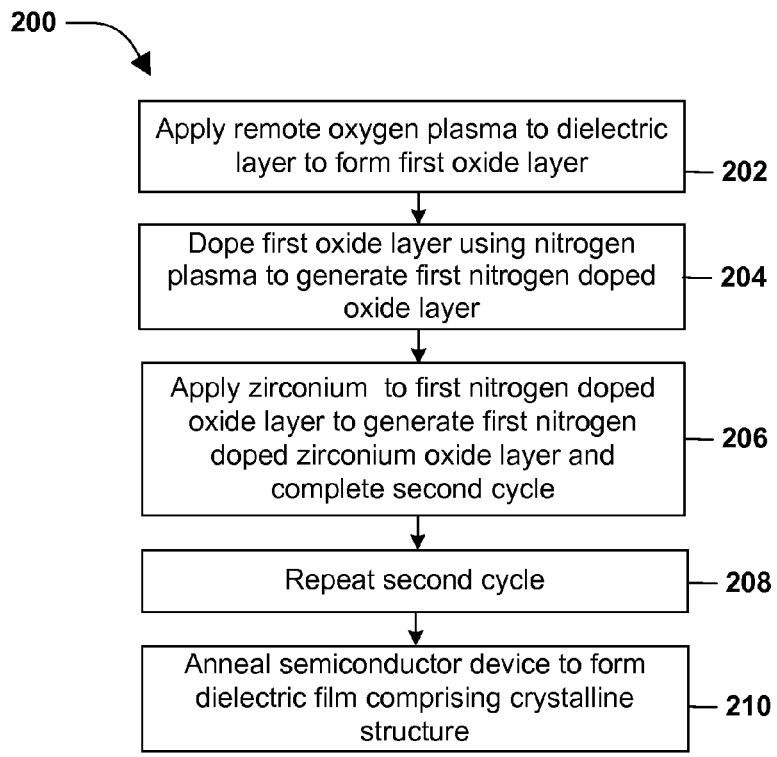
FIG. 2 is a flow diagram illustrating a method of forming a semiconductor device, in accordance with some embodiments.
Figure 8:
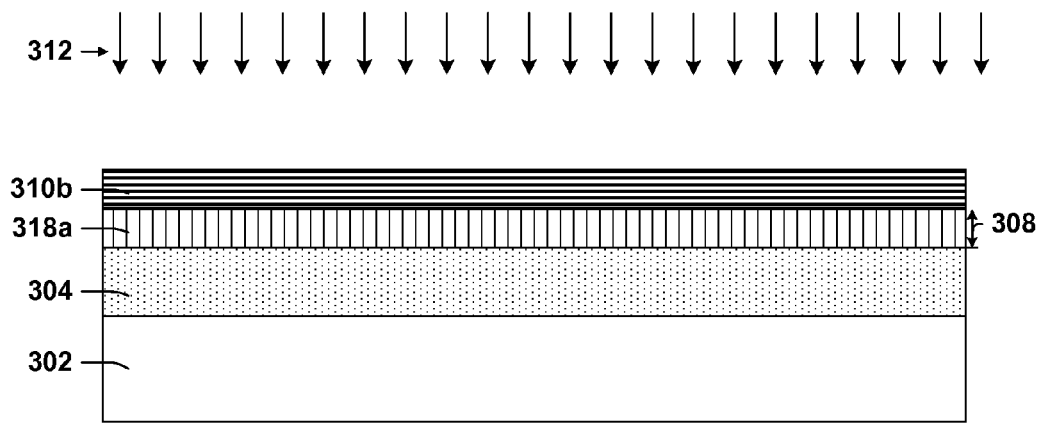
FIG. 8 is an illustration of a semiconductor device, in accordance with some embodiments.
Figure 9:
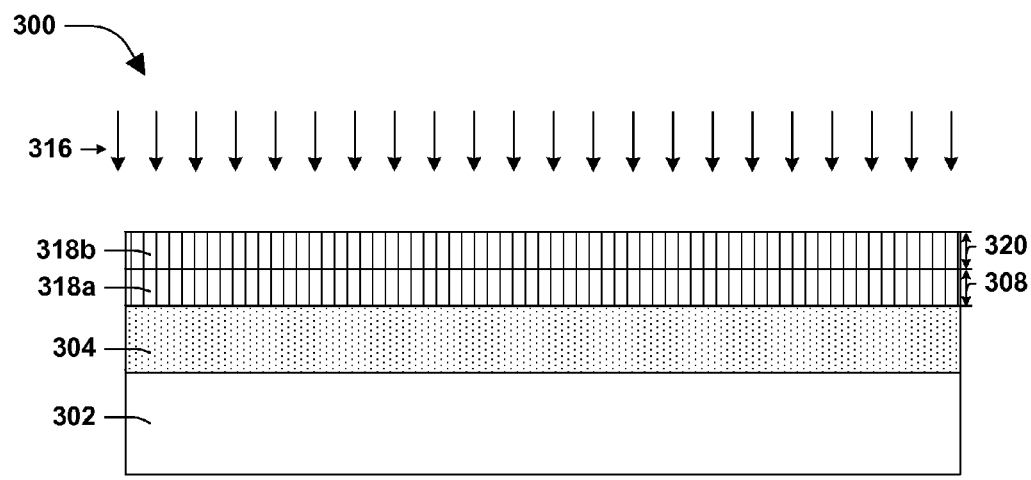
FIG. 9 is an illustration of a semiconductor device, in accordance with some embodiments.
Figure 10:
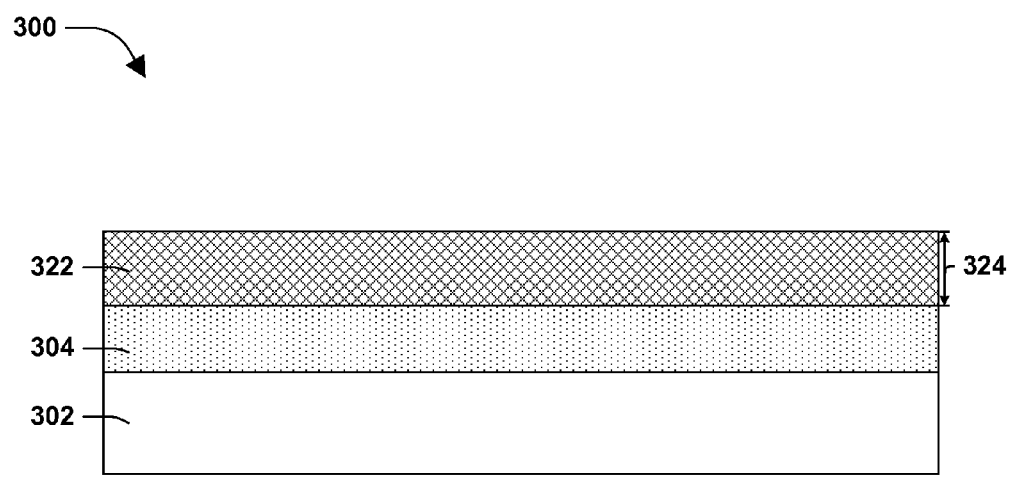
FIG. 10 is an illustration of a semiconductor device, in accordance with some embodiments.

A first method 100 of forming a semiconductor device 300 is illustrated in FIG. 1, and one or more semiconductor arrangements formed by such methodology are illustrated in FIGS. 3-10. A second method 200 of forming the semiconductor device 300 is illustrated in FIG. 2, and one or more semiconductor arrangements formed by such methodology are illustrated in FIGS. 12-19. As illustrated in FIGS. 10 and 19, the semiconductor device 300 comprises a dielectric film 322 over a dielectric layer 304, where the dielectric film 322 comprises a crystalline structure comprising a substantially uniform composition of zirconium, nitrogen and oxygen. In some embodiments, the substantially uniform composition of zirconium, nitrogen and oxygen implies a substantially uniform or non-varying distribution or concentration of zirconium throughout the dielectric film, a substantially uniform or non-varying distribution or concentration of nitrogen throughout the dielectric film and a substantially uniform or non-varying distribution or concentration of oxygen throughout the dielectric film. In some embodiments, the dielectric film 322 has a dielectric film thickness 324 between about 25 Å to about 75 Å. In some embodiments, the dielectric film 322 has a dielectric constant between about 28-29. In some embodiments, the dielectric film 322 has a leakage current density between about $4.5 \times 10^{-5}$ A/cm$^2$ to about $5.0 \times 10^{-5}$ A/cm$^2$. In some embodiments, the substantially uniform composition of nitrogen throughout the zirconium oxide of the dielectric film 322 increases the k value of the dielectric film 322 by between about 15% to about 17% as compared to a dielectric film that has a non-uniform composition of nitrogen throughout a zirconium oxide layer. In some embodiments, nitrogen deactivates oxygen vacancies in the zirconium oxide layer of the dielectric film 322, such that the conductivity of the dielectric film 322 is reduced as compared to a dielectric film that has active oxygen vacancies.

Figure 3:
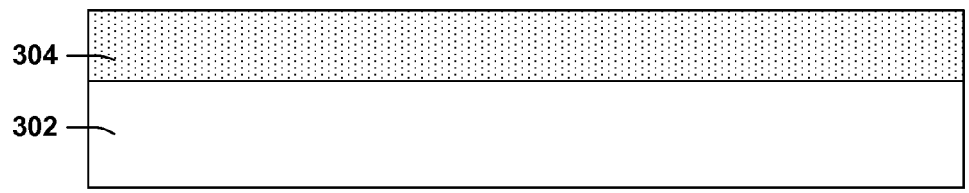
FIG. 3 is an illustration of a semiconductor device, in accordance with some embodiments.
Figure 4:
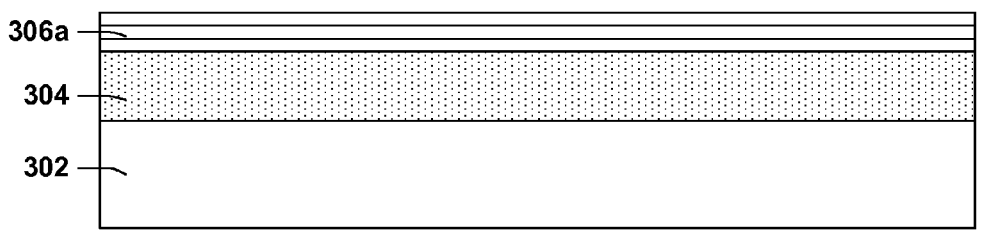
FIG. 4 is an illustration of a semiconductor device, in accordance with some embodiments.

At 102, a first zirconium layer 306a is formed over the dielectric layer 304, as illustrated in FIG. 4, according to some embodiments. Turning to FIG. 3, prior to FIG. 4, the dielectric layer 304 is over a substrate 302, where the substrate 302 comprises an epitaxial layer, a silicon-on-insulator (S0I) structure, a wafer, or a die formed from a wafer, according to some embodiments. In some embodiments, the dielectric layer 304 comprises an oxide, such as silicon oxide. In some embodiments, the dielectric layer 304 comprises an active silicon oxide. In some embodiments, the dielectric layer 304 has a dielectric layer thickness between about 5Å to about 15Å. In some embodiments, the first zirconium layer 306a is grown, as illustrated in FIG. 4. In some embodiments, the first zirconium layer 306a is formed in a chamber. In some embodiments, the first zirconium layer 306a is formed by a first atomic layer deposition (ALD) of a zirconium precursor. In some embodiments, the zirconium precursor comprises Tetrakis-(ethylmethylamino) zirconium (TEMAZ, $Zr[N(C_2H_5)CH_3]_4$). In some embodiments, the first ALD is performed at least one of at a first temperature between about 150° C. to about 350° C. or at a first pressure between about 0.05torr to about 0.5torr. In some embodiments, the zirconium precursor is delivered into the chamber by an inert carrier gas, such as argon. In some embodiments, the zirconium precursor is delivered for a first duration between about 3s to about 20s. In some embodiments, the chamber is purged of the zirconium precursor using an inert gas, such as argon. In some embodiments, the first zirconium layer 306a has a first zirconium layer thickness between about 8 Å to about 12 Å.

Figure 5:
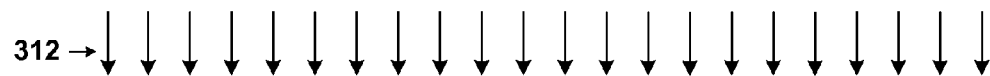
FIG. 5 is an illustration of a semiconductor device, in accordance with some embodiments.
Figure 5:
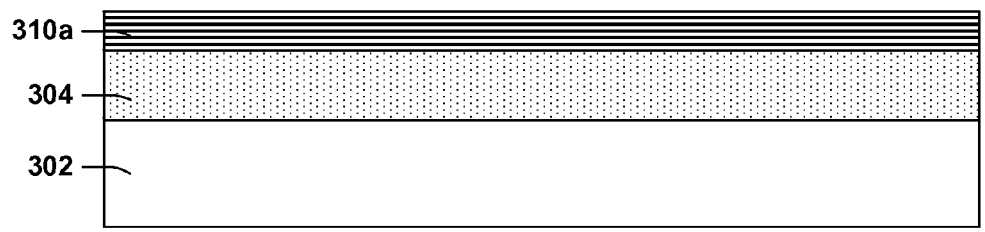

At 104, the first zirconium layer 306a is doped using nitrogen plasma 312 to generate a first nitrogen doped zirconium layer 310a, as illustrated in FIG. 5, according to some embodiments. In some embodiments, the nitrogen plasma 312 is generated by a radio-frequency coil at a power of 300 W under an injection of $NH_3$ or $N_2$ pulses. In some embodiments, the nitrogen plasma 312 comprises at least one of $NH_3$ plasma or $N_2$ plasma. In some embodiments, the nitrogen plasma 312 doping comprises in-situ doping of the first zirconium layer 306a. In some embodiments, the first nitrogen doped zirconium layer 310a comprises at least one of between about 25% to about 75% zirconium or between about 25% to about 75% nitrogen. In some embodiments, the first nitrogen doped zirconium layer 310a has a first nitrogen doped zirconium layer thickness between about 12 Å to about 20 Å. In some embodiments, the first zirconium layer 306a is doped using at least one of nitrogen plasma 312 at a first nitrogen plasma temperature between about 150° C. to about 350 C.° or at a first nitrogen plasma pressure between about 0.05 torr to about 0.5 torr. In some embodiments, the nitrogen plasma 312 doping occurs for a second duration between about 3 s to about 20 s. In some embodiments, the first zirconium layer 306a is doped using nitrogen plasma 312 in the same chamber as the first zirconium layer 306a is formed. In some embodiments, the first zirconium layer 306a is doped using nitrogen plasma 312 in a different chamber than the first zirconium layer 306a was formed.

Figure 6:
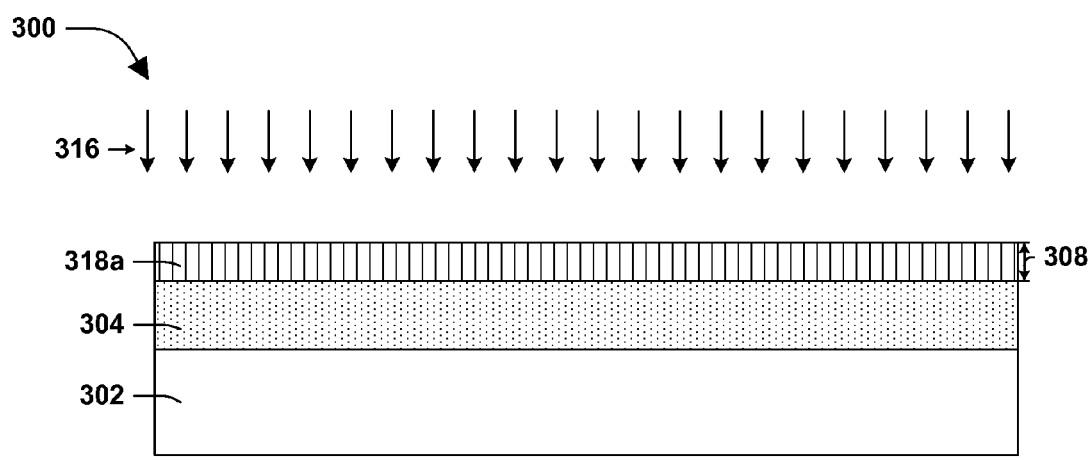
FIG. 6 is an illustration of a semiconductor device, in accordance with some embodiments.
Figure 11:
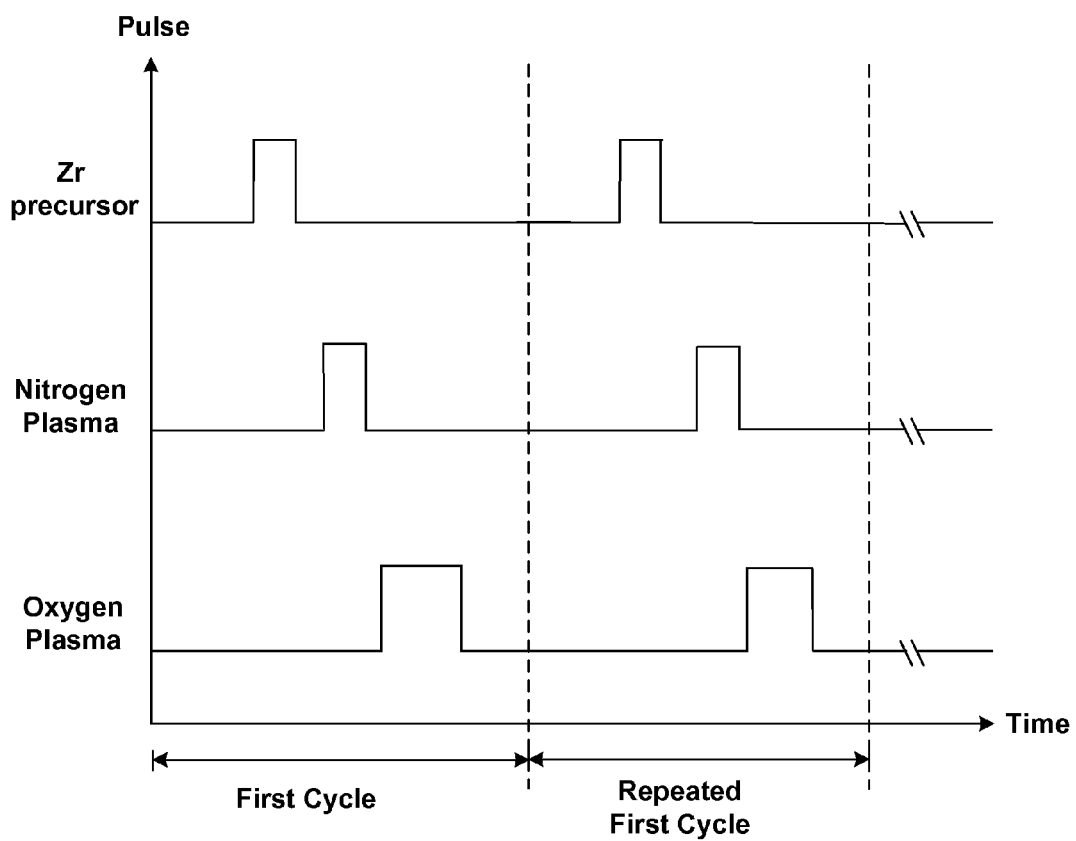
FIG. 11 is a schematic of a cycling process illustrating a method for forming a semiconductor device, in accordance with some embodiments.

At 106, remote oxygen plasma 316 is applied to the first nitrogen doped zirconium layer 310a to generate a first nitrogen doped zirconium oxide layer 318a as illustrated in FIG. 6, and to complete a first cycle as illustrated in FIG. 11, according to some embodiments. In some embodiments, the first cycle comprises forming the first zirconium layer 306a, doping the first zirconium layer 306a to generate the first nitrogen doped zirconium layer 310a, and applying the remote oxygen plasma 316 to the first nitrogen doped zirconium layer 310a to generate the first nitrogen doped zirconium oxide layer 318a. In some embodiments, the first nitrogen doped zirconium oxide layer 318a comprises at least one of between about 20% to about 40% zirconium, between about 25% to about 75% oxygen or between about 5% to about 35% nitrogen. In some embodiments, the first nitrogen doped zirconium oxide layer 318a has a first nitrogen doped zirconium oxide layer thickness 308a between about 15 Å to about 30 Å. In some embodiments, the remote oxygen plasma 316 application occurs for a third duration between about 10 s to about 40 s. In some embodiments, the first nitrogen doped zirconium oxide layer 318a is generated in the same chamber as the first nitrogen doped zirconium layer 310a was doped. In some embodiments, the first nitrogen doped zirconium oxide layer 318a is generated in a different chamber than the first nitrogen doped zirconium layer 310a was doped.

Figure 7:
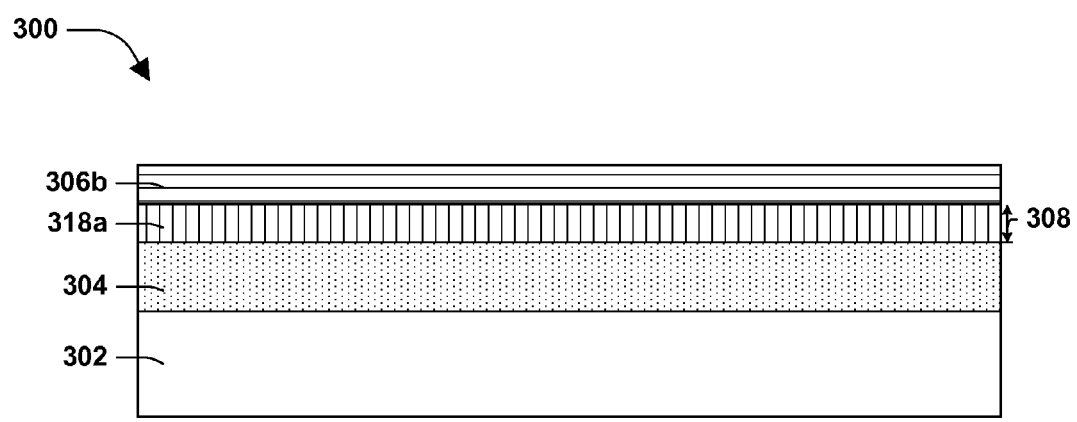
FIG. 7 is an illustration of a semiconductor device, in accordance with some embodiments.

At 108, the first cycle, as illustrated in FIG. 11, is repeated, as illustrated in FIGS. 7-9, according to some embodiments. In some embodiments, a second zirconium layer 306b is formed over the first nitrogen doped zirconium oxide layer 318a, as illustrated in FIG. 7. In some embodiments, the second zirconium layer 306b is formed in substantially the same manner as described above with regards to the first zirconium layer 306a, as illustrated in FIG. 4. In some embodiments, the second zirconium layer 306b is doped with nitrogen plasma 312 to generate a second nitrogen doped zirconium layer 310b, as illustrated in FIG. 8. In some embodiments, the second nitrogen doped zirconium layer 310b is formed in substantially the same manner as described above with regards to the first nitrogen doped zirconium layer 310a, as illustrated in FIG. 5. In some embodiments, remote oxygen plasma 316 is applied to the second nitrogen doped zirconium layer 310b to generate a second nitrogen doped zirconium oxide layer 318b as illustrated in FIG. 9. In some embodiments, the second nitrogen doped zirconium oxide layer 318b is formed in substantially the same manner as described above with regards to the first nitrogen doped zirconium oxide layer 318a, as illustrated in FIG. 6. Although, the first cycle is illustrated as being repeated once, it is contemplated that the first cycle would be repeated any number of times to form any number of layers 318, including merely a single layer 318a, to reach a desired thickness of the dielectric film 322.

At 110, the semiconductor device 300 is annealed to form the dielectric film 322 from the first nitrogen doped zirconium oxide layer 318a and the second nitrogen doped zirconium oxide layer 318b, if formed, and any other layers of 318, if formed, where the dielectric film 322 comprises a crystalline structure, as illustrated in FIG. 10, according to some embodiments. In some embodiments, the anneal is performed at an annealing temperature between about 300° C. to about 600 C.° for an annealing duration between about 20 min to about 40 min. In some embodiments, the anneal is performed in the presence of an annealing gas, the annealing gas comprising at least one of argon, nitrogen, or hydrogen. In some embodiments, the anneal is performed in a chamber. In some embodiments, the anneal occurs in the same chamber as at least one of the first zirconium layer 306a was formed, the first nitrogen doped zirconium layer 310a was doped, or the remote oxygen plasma was applied to generate the first nitrogen doped zirconium oxide layer 318a. In some embodiments, the first nitrogen doped zirconium oxide layer 318a is generated in a different chamber than the first nitrogen doped zirconium layer 310a was doped. In some embodiments, the anneal crystallizes the first nitrogen doped zirconium oxide layer 318a and the second nitrogen doped zirconium oxide layer 318b, if formed, and any other layers of 318, if formed, to form the dielectric film 322. In some embodiments, the dielectric film 322 comprises a substantially uniform composition of zirconium, nitrogen and oxygen, where uniform composition comprises a composition in which a uniform percentage of an element is found throughout the composition, such as if the dielectric film 322 has a top portion having 20% nitrogen, then the dielectric film 322 will have a middle portion having 20% nitrogen, and a bottom portion having 20% nitrogen. In some embodiments, the dielectric film 322 has the dielectric film thickness 324 between about 25 Å to about 75 Å.

According to some embodiments, FIG. 11 is a schematic illustrating a cycling process of the first cycle and the repeated first cycle. In some embodiments, a y-axis corresponds to a pulse intensity of the zirconium precursor, the nitrogen plasma and the oxygen plasma. In some embodiments, the x-axis corresponds to time in seconds. In some embodiments, a spike in a line along the y-axis indicates an increase in the pulse intensity of the corresponding element, such as the zirconium precursor, the nitrogen plasma and the oxygen plasma. In some embodiments, a spike width along the x-axis indicates the duration of a pulse. In some embodiments, the zirconium precursor pulses for a first duration at a first time, the nitrogen plasma pulses for a second duration at a second time, the second time after the first time and the oxygen plasma pulses for a third duration at a third time, the third time after the second time.

Turning to FIG. 2, the second method 200 of forming the semiconductor device 300 is illustrated, and one or more semiconductor arrangements formed by such methodology are illustrated in FIGS. 12-19, according to some embodiments.

Figure 12:
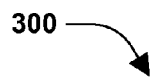
FIG. 12 is an illustration of a semiconductor device, in accordance with some embodiments.
Figure 12:
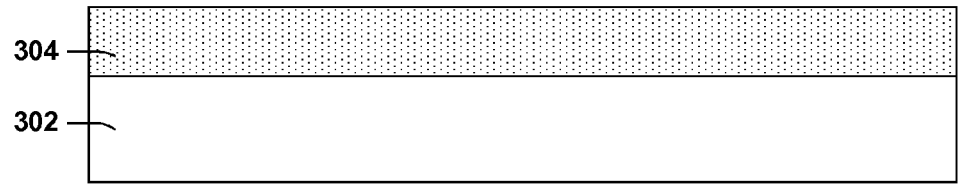
Figure 13:
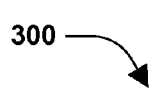
FIG. 13 is an illustration of a semiconductor device, in accordance with some embodiments.
Figure 13:
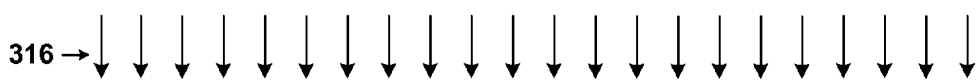
Figure 13:
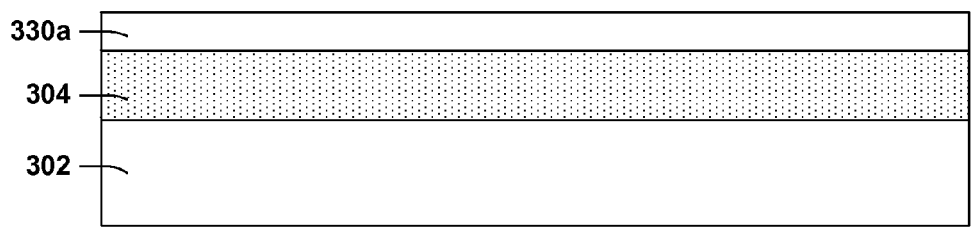

At 202, remote oxygen plasma 316 is applied to the dielectric layer 304 to generate a first oxide layer 330a, as illustrated in FIG. 13, according to some embodiments. Turning to FIG. 12, prior to FIG. 13, the dielectric layer 304 is formed over a substrate 302 in substantially the same manner and having substantially the same composition as described above with regards to the substrate 302 and the dielectric layer 304 illustrated in FIG. 3. In some embodiments, the first oxide layer 330a has a first oxide layer thickness between about 5 Å to about 15 Å. In some embodiments, the remote oxygen plasma 312 application occurs for the third duration between about 10 s to about 40s. In some embodiments, the first oxide layer 330a is generated in a chamber.

Figure 14:
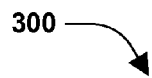
FIG. 14 is an illustration of a semiconductor device, in accordance with some embodiments.
Figure 14:
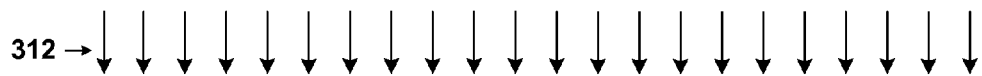
Figure 14:
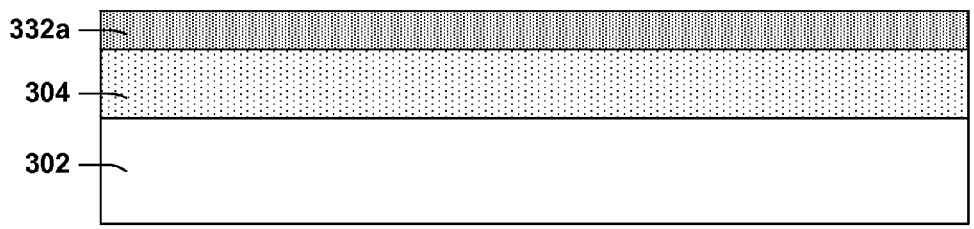

At 204, the first oxide layer 330a is doped using nitrogen plasma 312 to generate a first nitrogen doped oxide layer 332a, as illustrated in FIG. 14, according to some embodiments. In some embodiments, the nitrogen plasma 312 is generated by a radio-frequency coil at a power of 300 W under the injection of NH$_3$ or N$_2$ pulses. In some embodiments, the nitrogen plasma 312 comprises at least one of NH$_3$ plasma or N$_2$ plasma. In some embodiments, the nitrogen plasma 312 doping comprises in-situ doping of the first oxide layer 330a. In some embodiments, the first nitrogen doped oxide layer 332a comprises at least one of between about 25% to about 75% oxygen or between about 25% to about 75% nitrogen. In some embodiments, the first nitrogen doped oxide layer 332a has a first nitrogen doped oxide layer thickness between about 12 Å to about 20 Å. In some embodiments, the first nitrogen doped oxide layer 332a is doped using nitrogen plasma 312 at least one of at the first nitrogen plasma temperature between about 150° C. to about 350 C.° or at the first nitrogen plasma pressure between about 0.05 torr to about 0.5 torr. In some embodiments, the nitrogen plasma 312 doping occurs for the second duration between about 3s to about 20 s. In some embodiments, the first oxide layer 330a is doped using nitrogen plasma 312 in the same chamber as the first oxide layer 330a is formed. In some embodiments, the first oxide layer 330a is doped with nitrogen plasma 312 in a different chamber than the first oxide layer 330a was formed.

Figure 15:
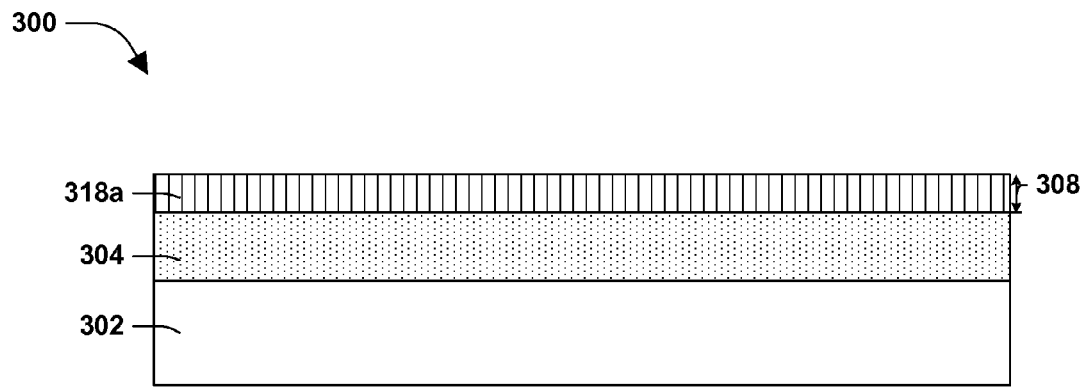
FIG. 15 is an illustration of a semiconductor device, in accordance with some embodiments.

At 206, zirconium is applied to the first nitrogen doped oxide layer 332a to generate the first nitrogen doped zirconium oxide layer 318a, as illustrated in FIG. 15, according to some embodiments. In some embodiments, the first nitrogen doped zirconium oxide layer 318a is generated in the same chamber as the first oxide layer 330a was doped. In some embodiments, the first nitrogen doped zirconium oxide layer 318a is generated in a different chamber than the first oxide layer 330a was doped. In some embodiments, the zirconium is applied by a second atomic layer deposition (ALD) of the zirconium precursor. In some embodiments, the second ALD is performed at least one of at the first temperature between about 150° C. to about 350 C.° or at the first pressure between about 0.05 torr to about 0.5 torr. In some embodiments, the zirconium interacts with nitrogen plasma 312 to form the first nitrogen doped zirconium oxide layer 318a. In some embodiments, the zirconium precursor is delivered into the chamber by an inert carrier gas, such as argon. In some embodiments, the zirconium precursor is delivered for the first duration between about 3 s to about 20 s. In some embodiments, the chamber is purged of the zirconium precursor using an inert gas, such as argon. In some embodiments, the first nitrogen doped zirconium oxide layer 318a comprises substantially the same composition as described above with regards to the first nitrogen doped zirconium oxide layer 318a, as illustrated in FIG. 6.

Figure 16:
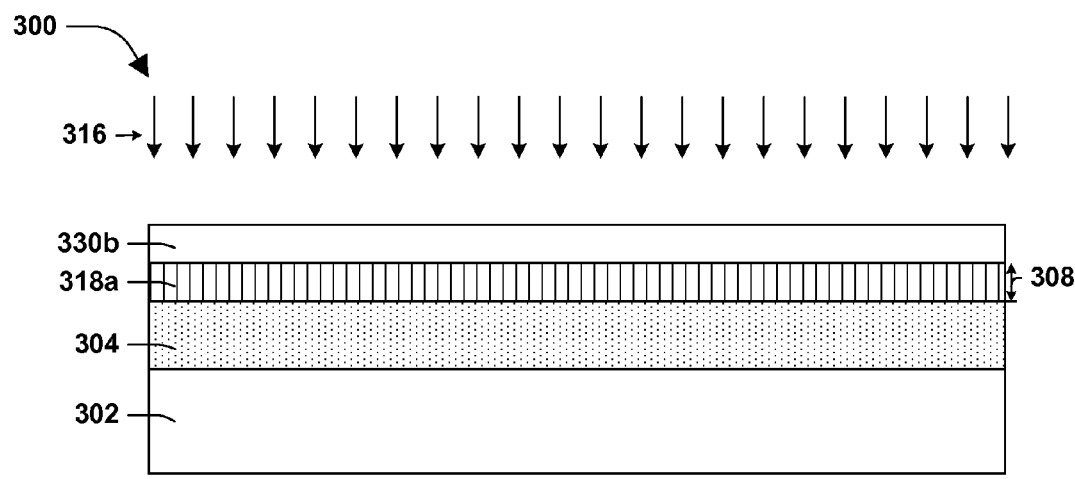
FIG. 16 is an illustration of a semiconductor device, in accordance with some embodiments.
Figure 17:
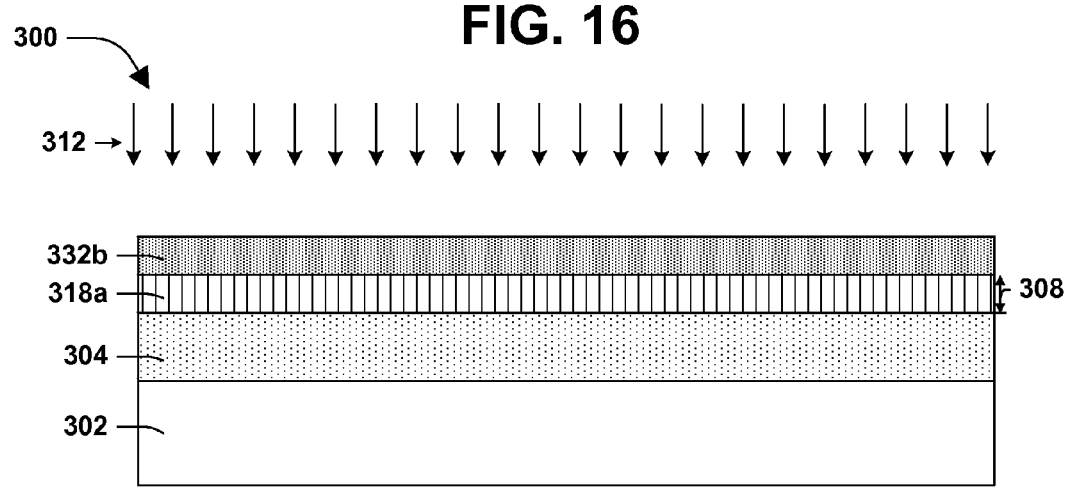
FIG. 17 is an illustration of a semiconductor device, in accordance with some embodiments.
Figure 18:
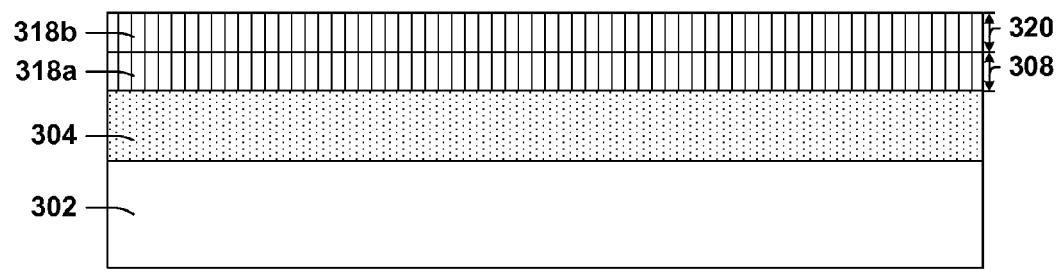
FIG. 18 is an illustration of a semiconductor device, in accordance with some embodiments.
Figure 19:
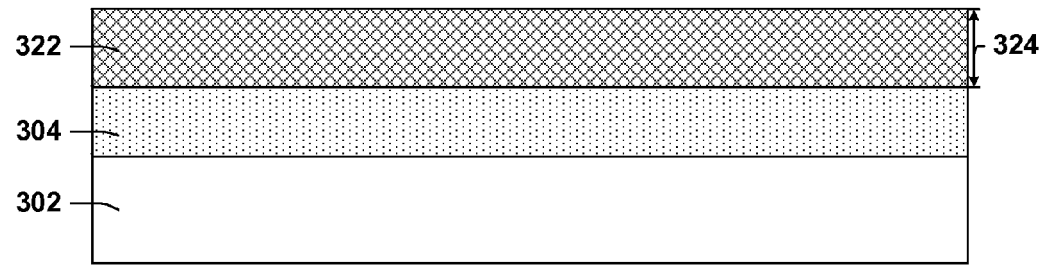
FIG. 19 is an illustration of a semiconductor device, in accordance with some embodiments.
Figure 20:
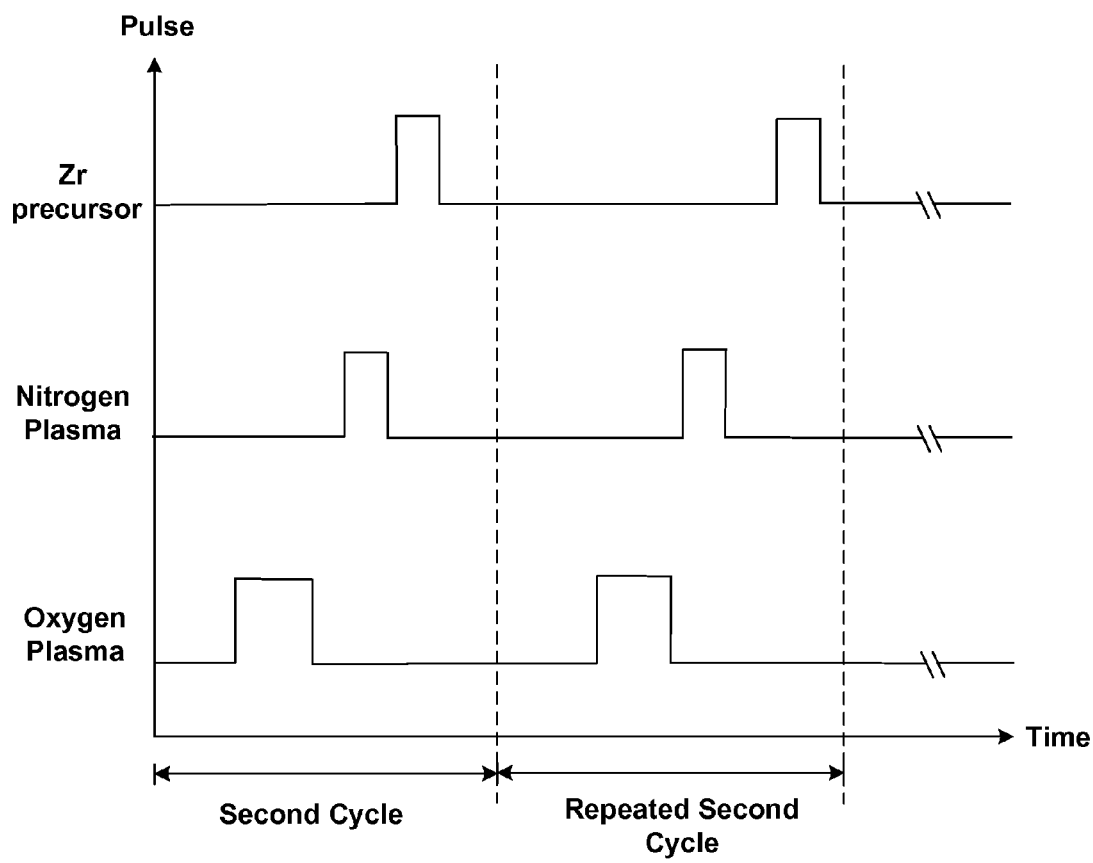
FIG. 20 is a schematic of a cycling process illustrating a method for forming a semiconductor device, in accordance with some embodiments.

At 208, the second cycle, as illustrated in FIG. 20, is repeated, as illustrated in FIGS. 16-18, according to some embodiments. In some embodiments, a second oxide layer 330b is formed over the first nitrogen doped zirconium oxide layer 318a, as illustrated in FIG. 16. In some embodiments, the second oxide layer 330b is formed in substantially the same manner as described above with regards to the first oxide layer 330a, as illustrated in FIG. 13. In some embodiments, the second oxide layer 330b is doped using nitrogen plasma 312 to generate a second nitrogen doped oxide layer 332b, as illustrated in FIG. 17. In some embodiments, the second nitrogen doped oxide layer 332b is formed in substantially the same manner as described above with regards to the first nitrogen doped oxide layer 332a, as illustrated in FIG. 14. In some embodiments, zirconium is applied to the second nitrogen doped oxide layer 332b to generate a second nitrogen doped zirconium oxide layer 318b as illustrated in FIG. 18, where any number of layers 318, including merely a single layer, are formed. In some embodiments, the second nitrogen doped zirconium oxide layer 318b is formed in substantially the same manner as described above with regards to the first nitrogen doped zirconium oxide layer 318a, as illustrated in FIG. 15.

At 210, the semiconductor device 300 is annealed to form the dielectric film 322 from the first nitrogen doped zirconium oxide layer 318a and the second nitrogen doped zirconium oxide layer 318b, if formed, and any other layers 318, if formed, where the dielectric film 322 comprises a crystalline structure, as illustrated in FIG. 19, according to some embodiments. In some embodiments, the anneal is performed in substantially the same manner as described above with regards to the anneal illustrated in FIG. 10. Although not illustrated, a gate electrode layer, such as of a conductive material, is formed over the dielectric film 322, according to some embodiments. In some embodiments the gate electrode layer, the dielectric film 322 and the dielectric layer 304 are patterned to form a gate stack of a transistor device where the gate stack comprises a gate electrode and a gate dielectric under the gate electrode, where the gate dielectric comprises the dielectric layer 304 and the dielectric film 322. In some embodiments, a density of interfacial states between the substrate 202, the dielectric layer 304 and the dielectric film 322 is reduced due to passivation by the hydrogen in the $NH_3$ plasma as compared to a gate dielectric that has not been exposed to $NH_3$ plasma. In some embodiments, the dielectric film 322 has a dielectric constant between about 28-29. In some embodiments, the dielectric film 322 has a leakage current density between about $4.5 \times 10^{-5}$ $A/cm^2$ to about $5.0 \times 10^{-5}$ $A/cm^2$. In some embodiments, the substantially uniform distribution of nitrogen throughout the zirconium oxide of the dielectric film 322 increases the k value of the dielectric film 322 by between about 15% to about 17% as compared to a dielectric film that has a non-uniform distribution of nitrogen through a zirconium oxide layer. In some embodiments, nitrogen deactivates oxygen vacancies in the zirconium oxide layer of the dielectric film 322, such that the conductivity of the dielectric film 322 is reduced as compared to a dielectric film that has active oxygen vacancies.

According to some embodiments, FIG. 20 is a schematic illustrating a cycling process of the second cycle and the repeated second cycle. In some embodiments, a y-axis corresponds to a pulse intensity of the zirconium precursor, the nitrogen plasma and the oxygen plasma. In some embodiments, the x-axis corresponds to time in seconds. In some embodiments, a spike in a line along the y-axis indicates an increase in the pulse intensity of the corresponding element, such as the zirconium precursor, the nitrogen plasma and the oxygen plasma. In some embodiments, a spike width along the x-axis indicates the duration of a pulse. In some embodiments, the oxygen plasma pulses for a third duration at a third time, the nitrogen plasma pulses for a second duration at a second time, the second time after the third time and the zirconium precursor pulses for a first duration at a first time, the first time after the second time.

According to some embodiments, a semiconductor device comprises a dielectric layer comprising oxide and a dielectric film over the dielectric layer. In some embodiments, the dielectric film comprises a crystalline structure comprising a substantially uniform composition of zirconium, nitrogen and oxygen.

According to some embodiments, a method of forming a semiconductor device comprises performing at least one of a first cycle or a second cycle and then annealing the semiconductor device. In some embodiments, the first cycle comprises forming a first zirconium layer over a dielectric layer of the semiconductor device, doping the first zirconium layer using nitrogen plasma to generate a first nitrogen doped zirconium layer and applying remote oxygen plasma to the first nitrogen doped zirconium layer to generate a first nitrogen doped zirconium oxide layer. In some embodiments, the second cycle comprises applying remote oxygen plasma to the dielectric layer to form a first oxide layer over the dielectric layer, doping the first oxide layer using the nitrogen plasma to generate a first nitrogen doped oxide layer and applying zirconium to the first nitrogen doped oxide layer to generate the first nitrogen doped zirconium oxide layer. In some embodiments, the annealing the semiconductor device forms a dielectric film from the first nitrogen doped zirconium oxide layer, the dielectric film comprises a crystalline structure, the crystalline structure comprising a substantially uniform composition of zirconium, nitrogen and oxygen.

According to some embodiments, a semiconductor device comprises a dielectric layer comprising oxide and a dielectric film over the dielectric layer. In some embodiments, the dielectric film comprises a crystalline structure comprising a substantially uniform composition comprising between about 20% to about 40% zirconium, between about 25% to about 75% oxygen and between about 5% to about 35% nitrogen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device comprising at least one of:
    a first cycle, the first cycle comprising:
        forming a first zirconium layer over a dielectric layer of the semiconductor device;
        doping the first zirconium layer using nitrogen plasma to generate a first nitrogen doped zirconium layer; and
        applying remote oxygen plasma to the first nitrogen doped zirconium layer to generate a first nitrogen doped zirconium oxide layer; or
    a second cycle, the second cycle comprising:
        applying remote oxygen plasma to the dielectric layer to form a first oxide layer over the dielectric layer;
        doping the first oxide layer using the nitrogen plasma to generate a first nitrogen doped oxide layer; and
        applying zirconium to the first nitrogen doped oxide layer to generate a first nitrogen doped zirconium oxide layer; and
    annealing the semiconductor device to form a dielectric film from the first nitrogen doped zirconium oxide layer, the dielectric film comprising a crystalline structure, the crystalline structure comprising a substantially uniform composition of zirconium, nitrogen and oxygen.

2. The method of claim 1, at least one of:
    the forming a first zirconium layer comprising performing a first atomic layer deposition (ALD) of a zirconium precursor, the zirconium precursor comprising Tetrakis-(ethylmethylamino) zirconium (TEMAZ, $Zr[N(C_2H_5)CH_3]_4$); or
    the applying zirconium comprising performing a second ALD of the zirconium precursor.

3. The method of claim 2, at least one of the first ALD or the second ALD performed at a first temperature between about 150° C. to about 350 C.° and at a first pressure between about 0.05 torr to about 0.5 torr.

4. The method of claim 1, at least one of:
    the doping the first zirconium layer comprising in situ doping the first zirconium layer using at least one of $N_2$ plasma or $NH_3$ plasma; or
    the doping the first oxide layer comprising in situ doping the first oxide layer using at least one of $N_2$ plasma or $NH_3$ plasma.

5. The method of claim 1, at least one of:
    repeating the first cycle; or
    repeating the second cycle.

6. The method of claim 1, the annealing comprising annealing at an annealing temperature between about 300° C. to about 600 C.° for an annealing duration between about 20 min to about 40 min, in the presence of an annealing gas, the annealing gas comprising at least one of argon, nitrogen, or hydrogen.

7. The method of claim 1, occurring within a chamber, the chamber purged using an inert gas between the forming a first zirconium layer and the doping the first zirconium layer, such that a zirconium precursor is removed from the chamber.

8. A method of forming a semiconductor device comprising:
    forming a first zirconium layer over a dielectric layer of the semiconductor device;
    doping the first zirconium layer using nitrogen plasma to generate a first nitrogen doped zirconium layer;
    applying remote oxygen plasma to the first nitrogen doped zirconium layer to generate a first nitrogen doped zirconium oxide layer; and
    annealing the first nitrogen doped zirconium oxide layer to form a dielectric film comprising a crystalline structure.

9. The method of claim 8, the forming a first zirconium layer comprising:
    growing the zirconium layer over the dielectric layer.

10. The method of claim 8, the forming a first zirconium layer comprising:
    depositing a zirconium precursor over the dielectric layer.

11. The method of claim 10, the zirconium precursor comprising Tetrakis-(ethylmethylamino) zirconium.

12. The method of claim 10, comprising:
    delivering the zirconium precursor into a chamber comprising the dielectric layer by an inert carrier gas.

13. The method of claim 10, the depositing a zirconium precursor comprising depositing the zirconium precursor for a first duration of time and the doping the first zirconium layer comprising doping the first zirconium layer for a second duration of time.

14. The method of claim 13, the first duration of time equal to the second duration of time.

15. The method of claim 14, the applying remote oxygen plasma comprising applying the remote oxygen plasma for a third duration of time different than the first duration of time.

16. The method of claim 15, the third duration of time greater than the first duration of time.

17. The method of claim 13, the applying remote oxygen plasma comprising applying the remote oxygen plasma for a third duration of time greater than the first duration of time and greater than the second duration of time.

18. The method of claim 8, comprising:
    forming a second zirconium layer over the first nitrogen doped zirconium oxide layer;
    doping the second zirconium layer using nitrogen plasma to generate a second nitrogen doped zirconium layer; and
    applying remote oxygen plasma to the second nitrogen doped zirconium layer to generate a second nitrogen doped zirconium oxide layer.

19. The method of claim 18, the annealing comprising:
    concurrently annealing the first nitrogen doped zirconium oxide layer and the second nitrogen doped zirconium oxide layer.

20. A method of forming a semiconductor device comprising:
    applying remote oxygen plasma to a dielectric layer of the semiconductor device to form a first oxide layer over the dielectric layer;
    doping the first oxide layer using nitrogen plasma to generate a first nitrogen doped oxide layer;
    applying zirconium to the first nitrogen doped oxide layer to generate a first nitrogen doped zirconium oxide layer; and
    annealing the semiconductor device to form a dielectric film from the first nitrogen doped zirconium oxide layer, the dielectric film comprising a substantially uniform composition of zirconium, nitrogen and oxygen.

* * * * *